US010060023B2

(12) United States Patent
Fischer et al.

(10) Patent No.: US 10,060,023 B2
(45) Date of Patent: Aug. 28, 2018

(54) BACKING PLATE FOR A SPUTTER TARGET, SPUTTER TARGET, AND SPUTTER DEVICE

(71) Applicant: Infineon Technologies AG, Neubiberg (DE)

(72) Inventors: Markus Fischer, Bannewitz OT Gaustritz (DE); Wolfram Karcher, Langebrueck (DE); Barbara Jeansannetas, Ottobrunn (FR)

(73) Assignee: Infineon Technologies AG, Neubiberg (DE)

( * ) Notice: Subject to any disclaimer, the term of this patent is extended or adjusted under 35 U.S.C. 154(b) by 446 days.

(21) Appl. No.: 13/656,622

(22) Filed: Oct. 19, 2012

(65) Prior Publication Data

US 2014/0110254 A1    Apr. 24, 2014

(51) Int. Cl.
| C23C 14/34 | (2006.01) |
| H01J 37/32 | (2006.01) |
| H01J 37/34 | (2006.01) |
| C23C 14/54 | (2006.01) |

(52) U.S. Cl.
CPC .......... *C23C 14/3407* (2013.01); *C23C 14/54* (2013.01); *H01J 37/32449* (2013.01); *H01J 37/3482* (2013.01)

(58) Field of Classification Search
CPC ................ H01J 37/32449; H01J 37/3482

USPC ....................... 204/298.09, 298.12
See application file for complete search history.

(56) References Cited

U.S. PATENT DOCUMENTS

| 4,983,269 | A | * | 1/1991 | Wegmann | C23C 14/34 |
| | | | | | 204/192.13 |
| 5,262,030 | A | * | 11/1993 | Potter | C23C 14/3407 |
| | | | | | 204/298.09 |
| 5,487,823 | A | | 1/1996 | Sawada et al. | |
| 7,063,773 | B2 | | 6/2006 | Ivanov et al. | |
| 2004/0020769 | A1 | | 2/2004 | Ivannov et al. | |
| 2004/0060817 | A1 | * | 4/2004 | Clarke | 204/298.07 |
| 2004/0079634 | A1 | | 4/2004 | Wickersham, Jr. et al. | |
| 2005/0269201 | A1 | | 12/2005 | Clark et al. | |
| 2007/0068796 | A1 | | 3/2007 | Hsiao et al. | |
| 2007/0068803 | A1 | | 3/2007 | Hsiao et al. | |
| 2007/0068804 | A1 | | 3/2007 | Hsiao et al. | |
| 2011/0174612 | A1 | | 7/2011 | Wu | |
| 2012/0175250 | A1 | | 7/2012 | Tanase et al. | |

FOREIGN PATENT DOCUMENTS

| DE | 3724937 A1 | 7/1988 |
| DE | 19607803 A1 | 9/1997 |
| DE | 102010052341 A1 | 5/2012 |

* cited by examiner

*Primary Examiner* — Jason M Berman
(74) *Attorney, Agent, or Firm* — Slater Matsil, LLP (57) ABSTRACT

A backing plate for a sputter target includes a target receiving part for receiving a target to be sputtered, and a structure for exposing the target receiving part through the backing plate.

21 Claims, 9 Drawing Sheets

BACKING PLATE FOR A SPUTTER TARGET, SPUTTER TARGET, AND SPUTTER DEVICE

BACKGROUND

Embodiments of the invention relate to the field of sputter deposition, more specifically to a backing plate for a sputter target, to a sputter target and to a sputter device.

During sputter deposition material, e.g. atoms, released from a target condensate on a substrate to form a layer. The process chamber in which the target and the substrate are arranged is substantially at vacuum so that the target atoms can reach the substrate without colliding with any remaining gas particles. Known sputter deposition approaches comprise DC sputtering, RF sputtering, ion beam sputtering, magnetron sputtering and reactive sputtering. During the process the target formed of the material from which the desired layer is to be formed erodes more and more, e.g., erosion grooves may be formed which advance towards the backing plate.

SUMMARY OF THE INVENTION

A backing plate for a sputter target includes a target receiving part for receiving a target to be sputtered thereat, and a structure formed in the substrate for exposing the target receiving part through the backing plate.

A sputter device includes a vacuum process chamber, a sputter target receptacle for mounting a sputter target in the process chamber, and a holder for receiving an element to be processed, wherein the sputter target receptacle includes a first port for connection to a sputter target port of a sputter target mounted thereto, and a second port connected to the first port and to the exterior of the process chamber.

BRIEF DESCRIPTION OF THE DRAWINGS

FIG. 1, which includes FIGS. 1(a) and 1(b), shows a schematic representation of a backing plate in accordance with embodiments of the invention to which a target to be sputtered is applied, wherein FIG. 1(a) shows a backside of the backing plate, and wherein FIG. 1(b) shows a cross-sectional view of the backing plate along the line b-b shown in FIG. 1(a);

FIG. 2, which includes FIGS. 2(a) and 2(b), shows photographic representations of a backing plate having bonded thereto a tantalum target, wherein FIG. 2(a) shows the backside of the sputter target, and wherein FIG. 2(b) shows the front side of the sputter target already partially eroded;

FIG. 3, which includes FIGS. 3(a) and 3(b), shows another embodiment of a backing plate having a modified structure for exposing the target receiving part, wherein FIG. 3(a) shows the front side of the backing plate, and wherein FIG. 3(b) shows a cross-sectional view along the line b-b in FIG. 3(a);

FIG. 4, which includes FIGS. 4(a) and 4(b), shows a further embodiment similar to the one of FIG. 3, wherein FIG. 4(a) shows the front side of the backing plate, and wherein FIG. 4(b) shows a cross-sectional view along the line b-b;

FIG. 5, which includes FIGS. 5(a) and 5(b), shows yet a further embodiment of the backing plate, similar to the one of FIG. 4, wherein FIG. 5(a) shows a front side of the backing plate, and wherein FIG. 5(b) shows a cross-sectional view along line b-b in FIG. 5(a);

FIG. 6, which includes FIGS. 6(a) and 6(b), shows an embodiment where the entire front side of the backing plate is the target receiving part, wherein FIG. 6(a) is a front side view of the backing plate 100, and wherein FIG. 6(b) is a cross-sectional view along line b-b in FIG. 6(a);

FIG. 7, which includes FIGS. 7(a) and 7(b), shows a further embodiment of a backing plate having grooves in the front side thereof and similar to the one of FIG. 4, wherein FIG. 7(a) is a front side view of the backing plate, and wherein FIG. 7(b) is a cross-sectional view along line b-b in FIG. 7(b);

FIG. 8, which includes FIGS. 8(a) and 8(b), shows an embodiment of a sputter device, wherein FIG. 8(a) shows a situation where a target is provided which has not yet eroded back to the backing plate, and FIG. 8(b) shows a situation where the target eroded back to the backing plate, thereby exposing the front side of the sputter target;

DETAILED DESCRIPTION OF ILLUSTRATIVE EMBODIMENTS

In the field of processing, e.g., semiconductor elements, like substrates, for generating a layer of a desired material on the surface of the element, sputter deposition is a known approach. During sputter deposition, material, e.g., atoms, from a target is removed and deposited on a surface of the substrate. The target is provided on a backing plate, for example by bonding the target to a major surface of the backing plate. The backing plate may be made from a material different from the material of the target. For example, the backing plate may be made from aluminum, and the target may be formed of tantalum. During the sputter deposition process the material of the target is used so that the target erodes. To avoid deposition of undesired materials the sputter process needs to be terminated once the target is eroded down to the backing plate so that it is at least partially exposed to the interior of a process chamber. This would result in the possibility of removing material (atoms) from the backing plate and depositing them on the substrate. The deposited layer would then have undesired contaminations.

Therefore, an end-of-life (EOL) detection for sputter targets is needed which include of a backing plate formed of a material that may be different from the material of the target. During sputtering, the target erodes more and more, and erosion grooves may be formed, i.e., the target may erode differently at different portions. The erosion grooves advance towards the backing plate and, finally, will expose the backing plate to the interior of the process chamber.

One possible EOL detection for a sputter target may be the counting of the amount of kilowatt hours (kWh) which may be sufficient to have a safe limit for using a sputter target until there is a need for changing the target provided thereon. A kilowatt hours counter may be implemented, for example by using an appropriate sputter tool software, and the kilowatt hours limit of the target currently used will depend on the process carried out, the process parameters and the like. The process takes place in a process chamber which has been evacuated. The kilowatt hours counting approach has the problem that one needs to have detailed knowledge about the limits, i.e., dependent on the setting of the process one has to have knowledge how long the process may be carried out until the limit is reached. In case the limit is unknown or cannot be determined accurately, this approach cannot be used. Also, in case there is a counting error, this approach will not work properly. In both situations it may happen that the target completely erodes so that erosion continues with the material of the backing plate and material from the backing plate is deposited on the element to be processed. This may be undesired and may actually be fatal, as this may yield the element to be processed useless, so that it may be necessary to discard the element.

Another approach for EOL detection of sputter targets makes use of a "modified" target. Such a modified target is not only formed of the material to be deposited, but also includes complex gas fillings or oxide structures which will generate end-of-life signals. However, this requires monitoring the sputter target, and also modifying the target which is expensive and may be difficult in the production process for generating the target.

Thus, there is a need for a simpler, less expensive and more reliable target EOL detection.

Figure 1:
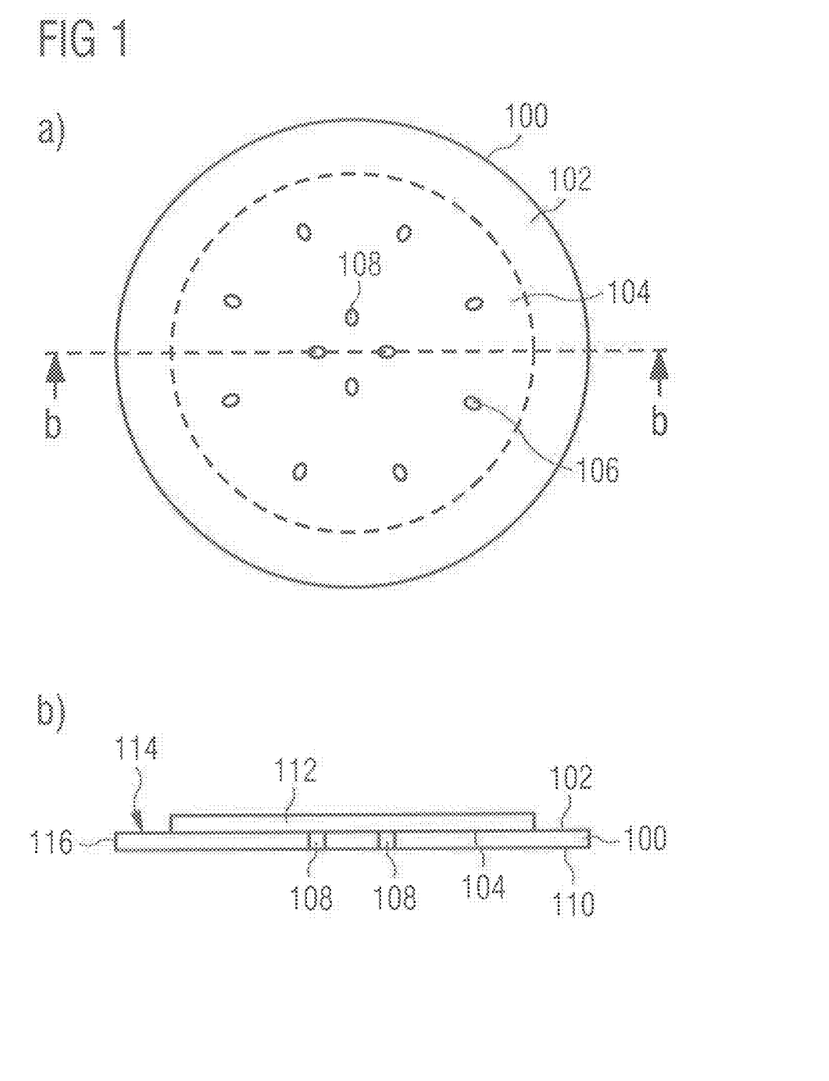

FIG. 1 is a schematic representation of a backing plate in accordance with embodiments of the invention to which a target to be sputtered is applied. FIG. 1(a) shows a backside of the backing plate, and FIG. 1(b) shows a cross-sectional view of the backing plate along the line b-b shown in FIG. 1(a).

FIG. 1(a) shows the backing plate 100 and its front side 102 on which a target (not shown in FIG. 1(a)) is to be mounted, for example by bonding. The area where the target is to be bonded to the backing plate, the target receiving part, is shown by the dotted circle 104. The backing plate 100 is of circular shape, however, it is noted that other embodiments may implement the backing plate 100 with other shapes, for example in a polygonal shape, a rectangular shape or a square shape. The backing plate 100 comprises a structure for exposing the target receiving part 104 through the backing plate 100. In the embodiment of FIG. 1, the structure includes a plurality of holes 106, 108. Two angular patterns of holes 106, 108 are provided concentrically within the area 104. The outer hole pattern includes eight holes 106, and the inner hole pattern includes four holes 108. The outer hole pattern has the holes 106 arranged circularly with an offset of about 45° between adjacent holes, and the inner hole pattern has the holes 108 arranged circularly with an offset of about 90°.

FIG. 1(b) shows the cross-sectional view of the backing plate 100 along lines b-b, now including a target 112 at the front side 102, for example a tantalum target, that may be fixed to the target receiving part 104 of the backing plate 100 by bonding. The target receiving part 104 does not cover the entire front side 110 of the backing plate 100, thereby defining a peripheral flange portion 114 outside the target receiving part 104. When mounting the backing plate 100 with the target 112 bonded thereto into a process device, a sputter target receptacle is configured to receive the backing plate 100 at a mounting surface which is in contact with the flange area 114.

As can be seen from FIG. 1(b) by means of the holes 106, 108, a structure is defined in the backing plate 100 which exposes the target receiving part 104 through the material of the backing plate 100. While FIG. 1 shows an example where the holes 106, 108 extend from the front side 102 to the backside 110 of the backing plate 100 it is noted that other embodiments may have a different shape of the holes, for example, the holes do not need to be straight holes as shown in FIG. 1(b), rather, the holes may be inclined with regard to the opposing main surfaces 102, 110 of the backing plate 100 or may extend inside the backing plate 100 to the side surface 116 of the backing material connecting the front side 102 and back side 110.

In accordance with embodiments of the invention, a backing plate for a target to be sputtered is provided, and from the backside of the backing plate holes 106, 108 are implemented to extend through the backing plate 100. As is mentioned above, the target 112 may erode in such a way that erosion grooves are formed, and the circular pattern of holes 106, 108 shown in FIG. 1 are provided at positions where the main erosion grooves are known to occur, thereby implementing a predefined "breaking point." More specifically, during the sputtering process, an erosion groove will finally hit the backing material 100 at a position where a hole 106, 108 is formed. The holes 106, 108 may be coupled to the exterior of the process chamber in which the target is mounted so that, once an erosion groove hits one or more of the holes 106, 108, a connection between the exterior of the process chamber and the interior of the process chamber exists so that the vacuum inside the process chamber or sputter chamber can no longer be sustained and sputtering will be aborted substantially immediately. In other examples, the holes 106, 108 may be coupled via the sputter target receptacle to a device allowing for a water breakthrough having the same effect that the sputter chamber cannot sustain the vacuum and that sputtering is aborted substantially immediately.

In accordance with an embodiment, the above-described approach for determining the end-of-life of a target using a kilowatt hours counter may still be used, however, in case of a failure or in case the limits are not sufficiently known, the sputter system will stop working at the end of the target's life without erosion of the backing plate that may be formed from a different material when compared to the target, thereby avoiding the contamination of a layer to be deposited on an element to be processed.

Figure 2:
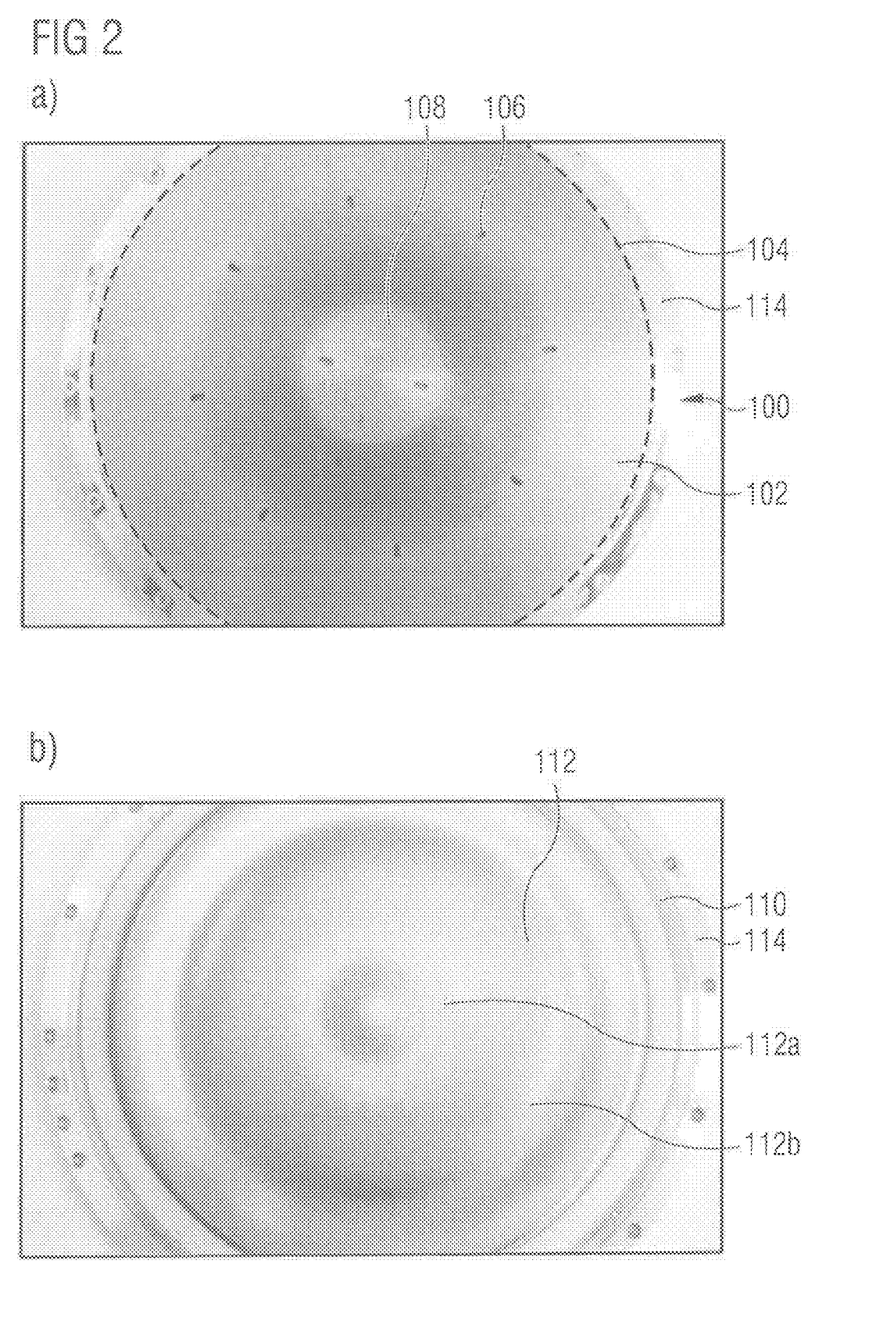

FIG. 2 shows photographic representations of a backside and a front side of a backing plate formed of aluminum having bonded to its target receiving part a tantalum target. FIG. 2(a) shows the backside of the sputter target, and FIG. 2(b) shows the front side of the sputter target already partially eroded. In FIG. 2(a) the flange area 114 can be seen for mounting the sputter target to a target receptacle in a sputter device. The holes 106 and 108 have an elongated shape. FIG. 2(b) shows the front side of the sputter target after a kilowatt hour count of 1582. The target 112 is shown and, also the two erosion grooves 112a and 112b can be seen which are formed at positions where the respective circular hole patterns 106, 108 are formed.

The sputter target shown in FIG. 2 was used for sputtering in a normal sputtering process and no influence of the holes 106, 108 with regard to the sputter process was discovered. FIG. 2(b) shows the sputter target after a kilowatt hours count of 1582 which, in the described embodiment, was considered the "normal lifetime" and no problems sputtering an element to be processed were recognized. During the sputtering process the grooves 112a and 112b are formed by the erosion of the target, however, in FIG. 2(b) the grooves have not yet reached the backing plate material. The target shown in FIG. 2(b), after the above-mentioned normal lifetime, was further used for sputtering until the erosion grooves reached the backing plate and the holes. When the erosion grooves reached the holes, the sputtering process stopped substantially immediately as the vacuum, due to the connection of the process chamber via the holes 106, 108 to the outside of the process chamber, could no longer be sustained. The results of the sputtering process following the normal lifetime after burn-through (until EOL detection in accordance with embodiments of the invention) proved to produce deposited layers of the desired quality.

Thus, in accordance with embodiments, an improved backing plate for receiving a sputter target is provided which allows secure use of the target until the target material actually has eroded down to the material of the backing plate. Thus, not only a reliable EOL detection can be provided, but also an elongated use of the target which may provide for a more efficient sputtering process as the target may need to be changed only once the target has actually eroded down to the backing material.

Figure 3:
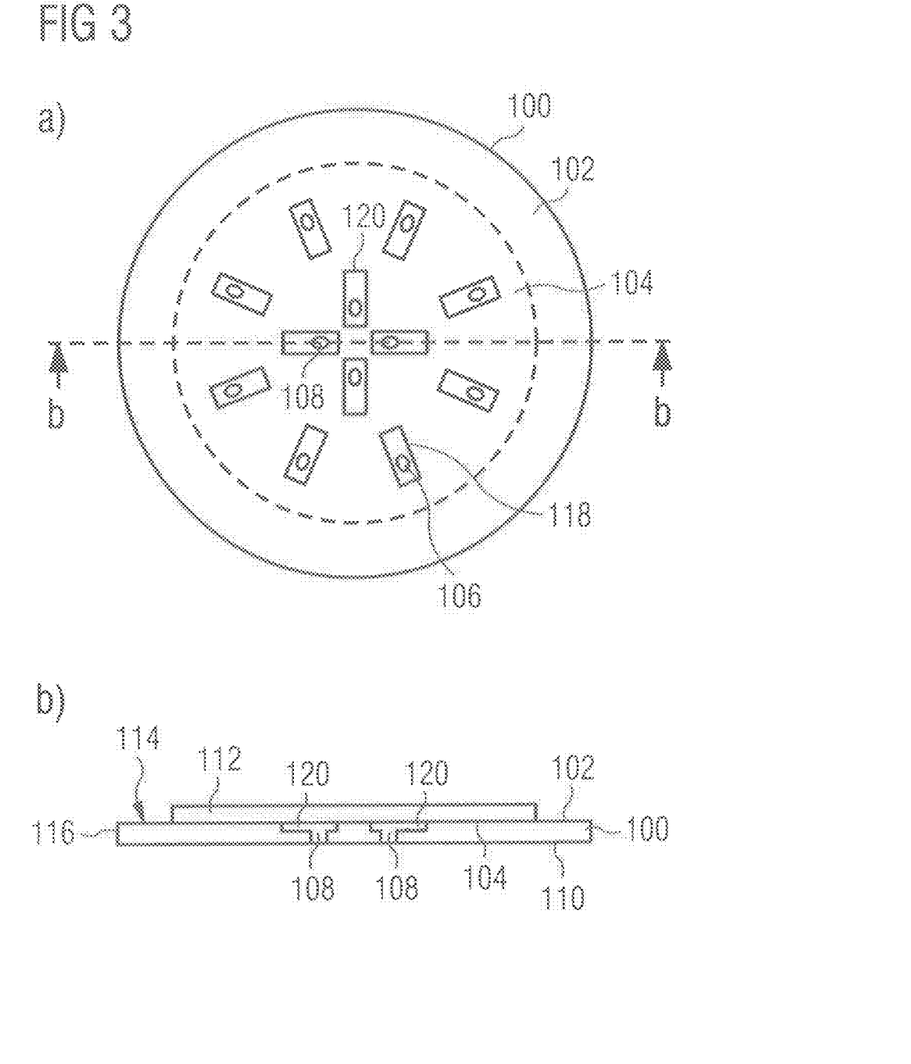

FIG. 3 shows a further embodiment of a backing plate having a modified structure for exposing the target receiving part on the backing plate through the material of the backing plate. FIG. 3(a) shows the front side of the backing plate, and FIG. 3(b) shows a cross-sectional view along the line b-b in FIG. 3(a). As can be seen from FIG. 3(a), the backing plate 100 corresponds substantially to the one shown in and described with regard to FIG. 1(a). When compared to FIG. 1(a) the structure for exposing area 104 through the backing plate 100 further includes grooves 118, 120. More specifically, each of the openings 106, 108 has associated therewith a groove 118, 120 which are formed in the surface 102 and extending in a radial direction as is depicted in FIG. 3(a). FIG. 3(b) shows the cross-sectional view along line b-b in FIG. 3(a). As can be seen, the grooves 120 extend over a larger area when compared to the holes of FIG. 1. In accordance with the embodiment of FIG. 3 a larger area where the erosion grooves may occur can be covered, thereby providing for a backing plate 100 that can be used for a different target material for which, during sputtering, erosion grooves are formed at different positions.

Figure 4:
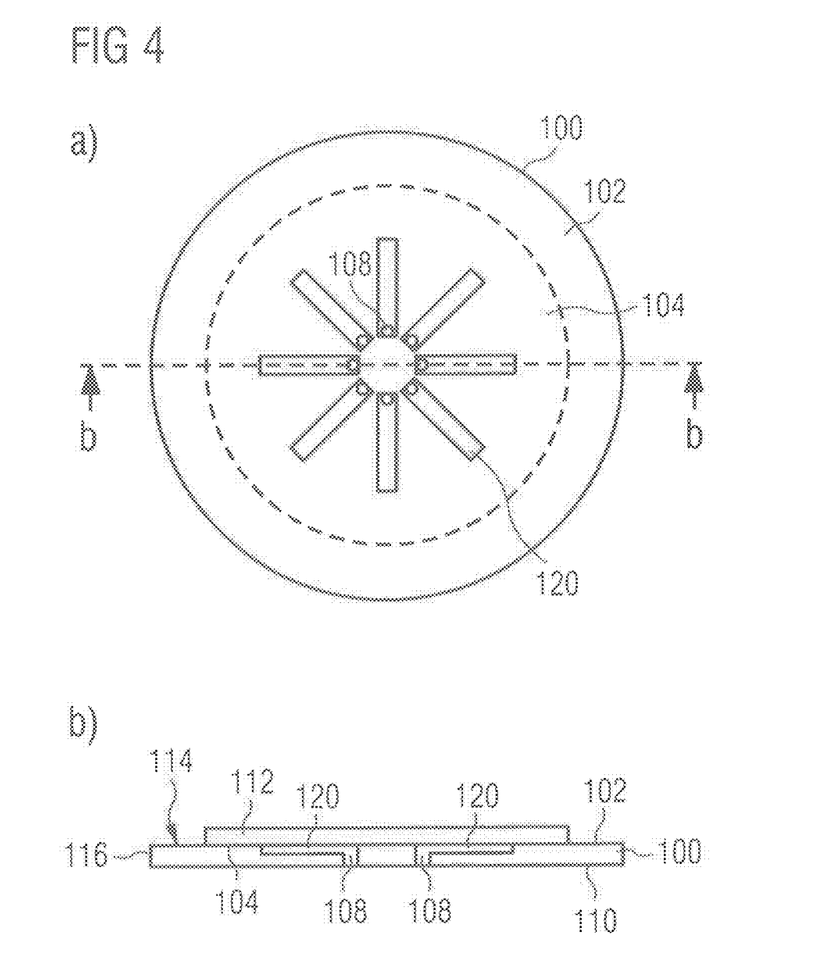

FIG. 4 shows a further embodiment similar to the one of FIG. 3, also including grooves in a front side of the backing plate 100. FIG. 4(a) shows the front side of the backing plate 100, and FIG. 4(b) shows a cross-sectional view along the line b-b. In the embodiment of FIG. 4, only the holes 108 are formed close to the center of the backing plate 100, however, the number of holes 108, when compared to FIGS. 1 and 3 is increased. Further, each of the holes 108 has associated therewith a groove extending radially outward towards the edge of the target receiving part 104. In a similar way as the embodiment of FIG. 3, targets having in different erosion groove positions can be placed on the backing plate 100 without the need of exactly knowing where the grooves actually exist in view of radially extending grooves 120 connected via the holes 108 to the backside 110 of the backing plate 100.

Figure 5:
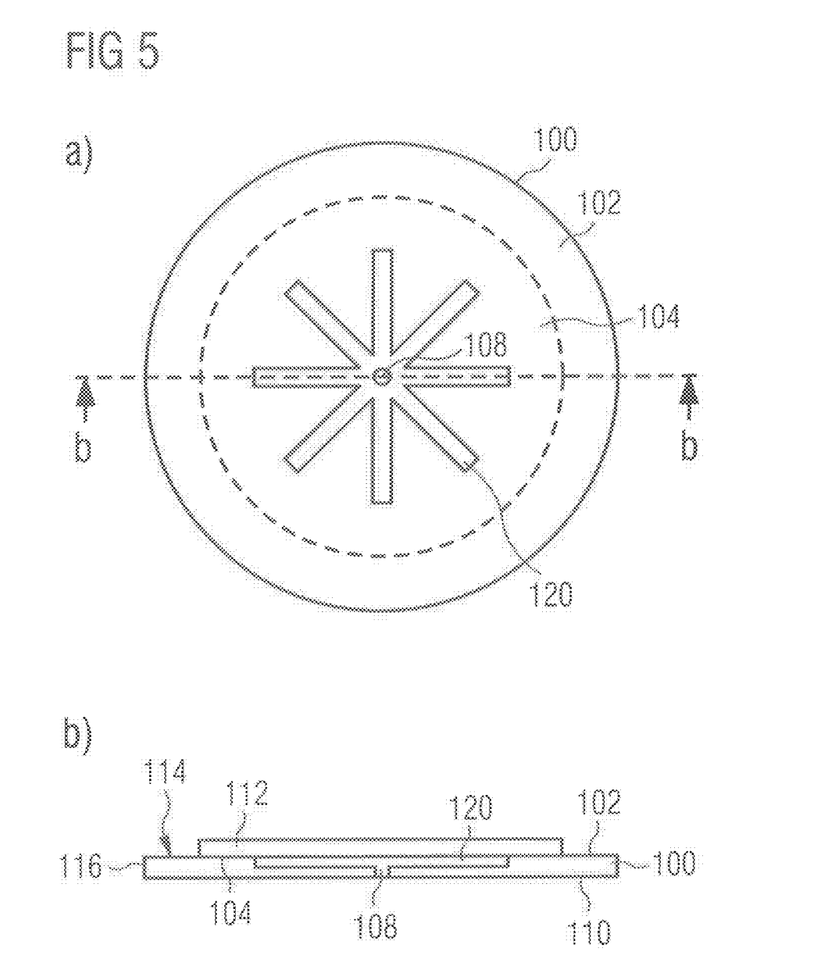

FIG. 5 shows yet a further embodiment of the backing plate, similar to the one of FIG. 4. FIG. 5(a) shows a front side of the backing plate, and FIG. 5(b) shows a cross-sectional view along line b-b in FIG. 5(a). A plurality of radially extending grooves 120 are formed with a common area at the center of the backing plate 100 where the hole 108 is formed for providing a connection of the grooves 120 to the backside 110 of the backing plate. The functionality of the backing plate 100 is substantially the same as the functionality of the backing plates of FIGS. 3 and 4.

In the above-described embodiments, the backing plate 100 had the flange area 114 exterior of the target receiving area 104 on which the target 112 is to be bonded. In these embodiments, the target 112 has an area that is smaller than the upper surface 102 of the backing plate 100. However, embodiments of the invention are not limited to such a structure, rather, the entire front side 102 of the backing plate 100 may be the target receiving part or portion 104.

Figure 6:
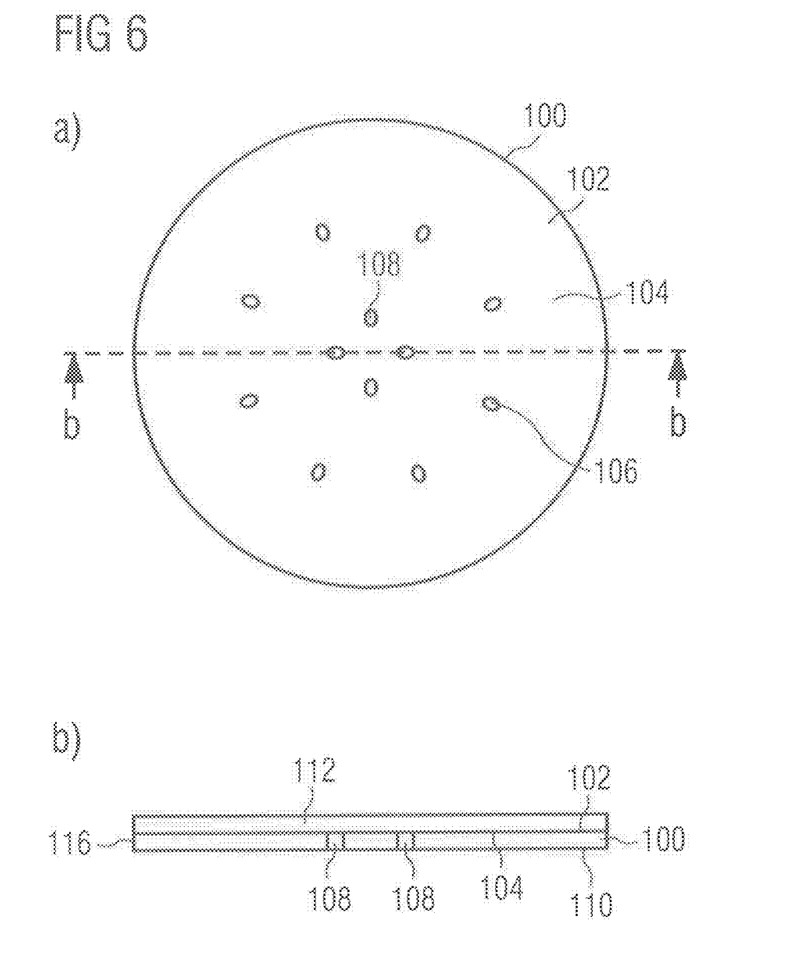

FIG. 6 shows an embodiment where the entire front side of the backing plate is the target receiving part. FIG. 6(a) is a front side view of the backing plate 100, and FIG. 6(b) is a cross-sectional view along line b-b in FIG. 6(a). The backing plate in FIG. 6 corresponds substantially to the backing plate of FIG. 1 except that the target receiving part 104 corresponds to the entire front side 102 of the backing plate 100. The circular hole patterns 106, 108 are provided in a similar way as has been described above with regard to FIG. 1. It is noted that in addition to the two circular patterns further circular patterns may be provided, also in the other embodiments or only a single circular pattern, either pattern 106 or pattern 108 may be used.

Figure 7:
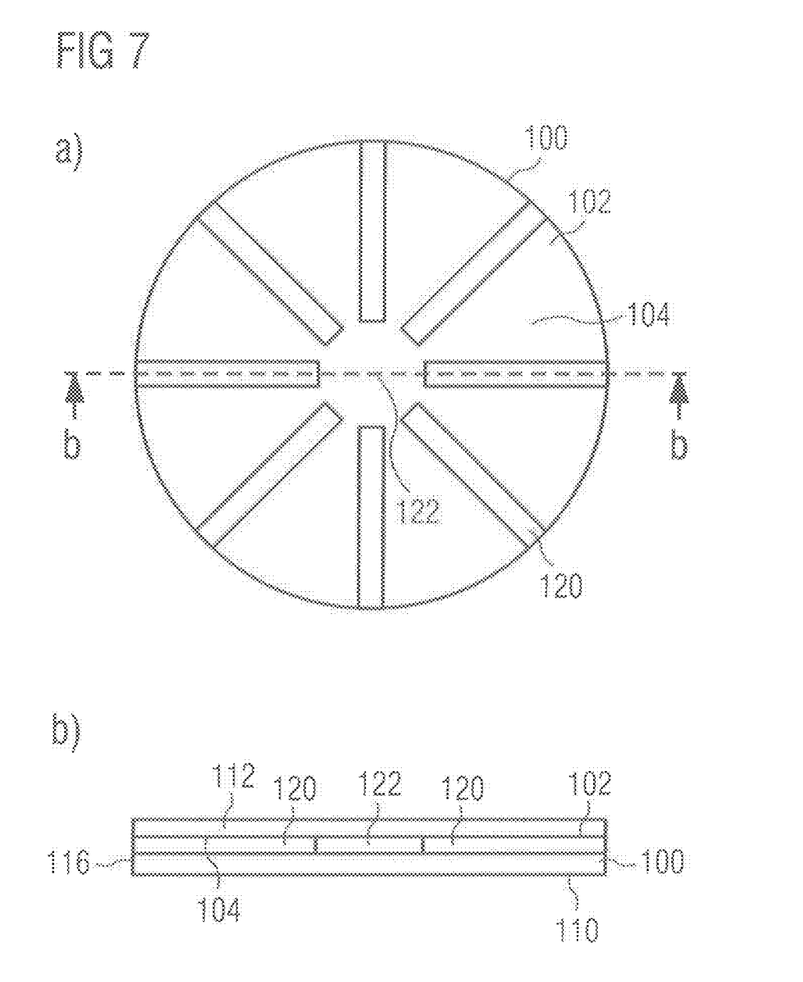

FIG. 7 shows a further embodiment of a backing plate having grooves in the front side thereof, wherein the front side corresponds to the target receiving part. FIG. 7(a) is a front side view of the backing plate, and FIG. 7(b) is a cross-sectional view along line b-b in FIG. 7(b). As shown in FIG. 7(a) the target receiving part 104 corresponds to the front side 102 and, in a similar way as in FIGS. 4 and 5, a plurality of radially extending grooves 120 are provided. The grooves 120 extend from a central part 122 where they may be connected or not connected (as shown in FIG. 7) toward the outer peripheral edge of the backing plate 100, more specifically the grooves 120 extend from the central part 122 to the side face 116 connecting the upper and lower surfaces 102, 110 of the backing plate 100.

As can be seen from FIGS. 6 and 7, in these embodiments the target 112, initially, covers the entire surface of the backing plate 100, and in such embodiments, the backing plate 100 is mountable to a process chamber by appropriate mounting elements that may be provided on the backside 110 of the backing plate.

Figure 8:
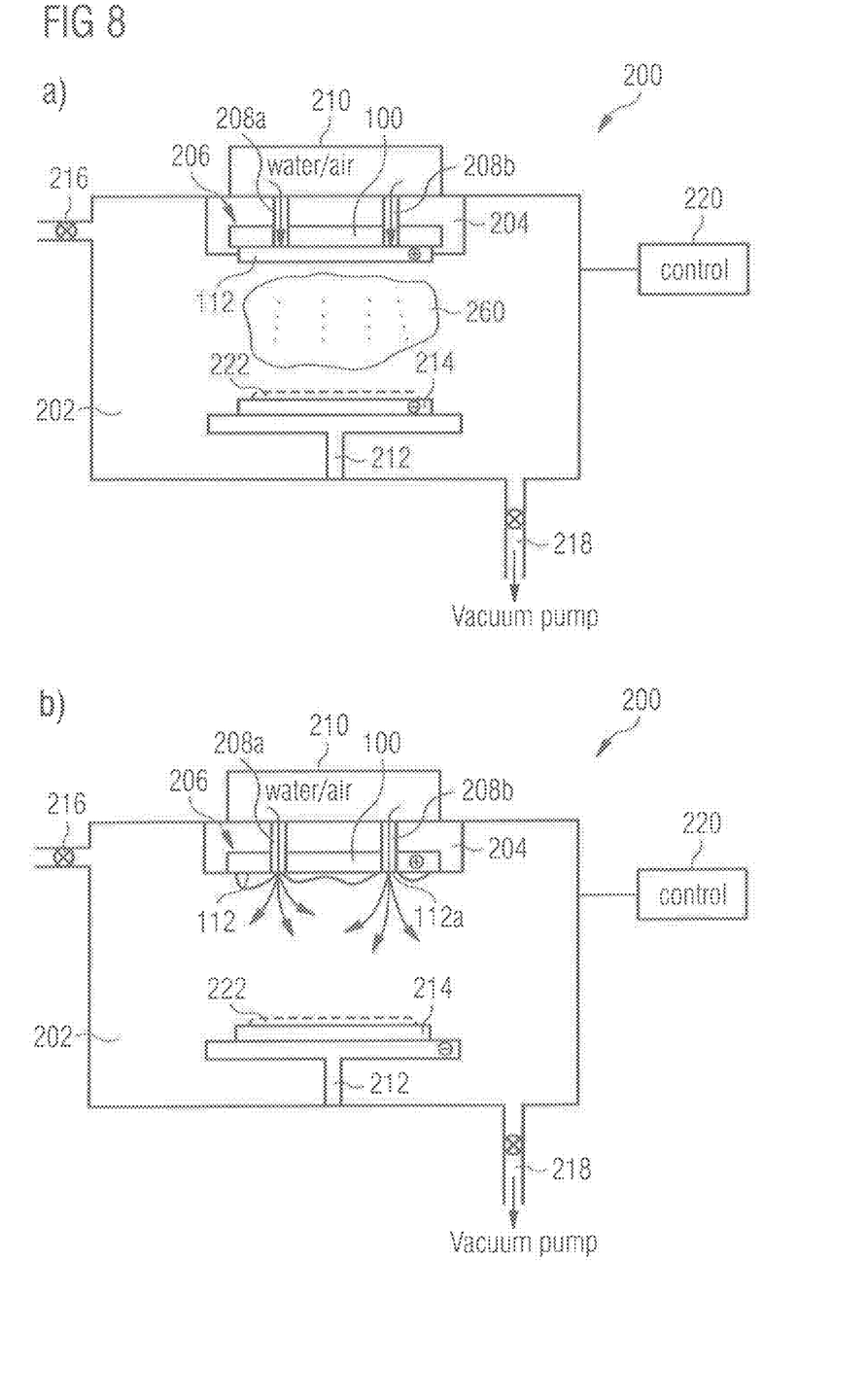

FIG. 8 shows an example of a sputter device, wherein FIG. 8(a) shows a situation where a target is provided which has not yet eroded back to the backing plate, and FIG. 8(b) shows a situation where a sputter target of the invention is used in which the target eroded back to the backing plate, thereby exposing the front side of the sputter target to the opening.

FIG. 8(a) is a schematic representation of a sputter device or a sputter deposition apparatus 200 including a process chamber 202, and a sputter target receptacle 204 for receiving a sputter target 206 including a backing plate 100 and a target 112. The backing plate 100 may be a backing plate as described in the above embodiments shown in FIGS. 1-7. The receptacle 204 includes a first port for connecting the openings of the backing plate 100 to the exterior of the process chamber 202. In the embodiment shown in FIG. 8(a) the first port includes openings 208a, 208b for coupling the openings in the backing plate 100 to an external vacuum shutdown unit 210 of the sputter device 200. The sputter device 200 further includes a holder 212 on which an element 214 to be processed, for example in a substrate, is arranged. An input valve 216 is provided for applying to the chamber 202 a process gas, and a vacuum port 218 is provided connected to a vacuum pump (not shown) for providing in the chamber 202 the required vacuum. Further, a control 220 is schematically shown which is used for controlling the respective elements of the sputter device 200, especially the required electrical units (not shown) for applying respective potentials to the target and to the element to be processed. In the depicted embodiment, it is assumed that the target 100, 112 is at a positive potential, whereas the element 214 to be processed is at a negative potential. Operating the device 200 results in the generation of a plasma 260 between the target 112 and the element 214 and results in the removal of material, e.g., atoms, from the target 112 which condenses on a surface of the element 214 to form a desired layer 222 from the material removed from the target 112.

FIG. 8(a) shows the normal operation of the sputter device 200, i.e., the situation where the erosion of the target 112 did not yet reach the backing plate 100. Thus, any fluid, like ambient air or water provided by the unit 210 cannot reach the interior of the process chamber 202, as is depicted by the arrows ending on the backside of the target 112.

Using the backing plate and the sputter target in accordance with embodiments of the invention, allows operating the sputter device 200 until the target eroded down onto the backing plate, which would result in the deposition of a contaminated layer. Since the backing plate 100 may be formed of a material different from the target, this would result in undesired materials being part of the deposited layer or film 222 which may be undesired and result in the need to discard the processed element 214.

When using the backing plate as described in the above embodiments, such situations can be avoided, and FIG. 8(b) shows a situation where the target 112 eroded back to the backing plate 100, for example due to the formation of erosion grooves described above with regard to FIG. 2. As can be seen from FIG. 8(b) the erosion groove 112a reached the backing plate 100, thereby exposing the opening of the holes in the backing plate towards the process chamber 202. By means of the holes 208a, 208b in the sputter target receptacle 204 the first port of the sputter target receptacle coupled to the openings of the backing plate 100 is connected to a second port of the receptacle coupled to the exterior of the device 200 or to the unit 210, thereby allowing water or air to enter the interior of the process chamber 202 so that, as a result, the vacuum inside the chamber 202 can no longer be sustained and the sputtering process aborts substantially immediately without any contamination of the film 222 already deposited onto the substrate 214.

Figure 9:
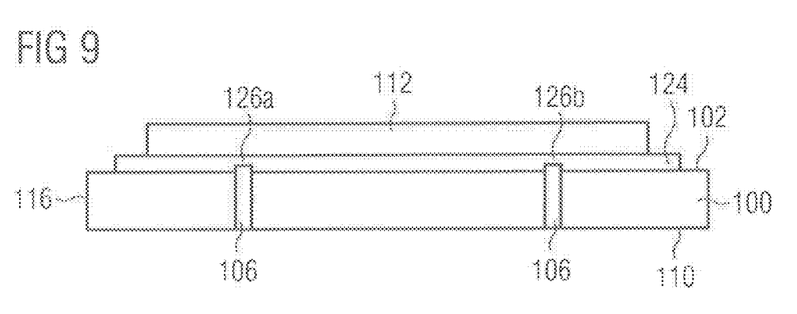
FIG. 9 shows another embodiment of a backing plate including an intermediate layer provided on the front side of the backing plate and with holes terminating at a distance from the front side of the intermediate layer.

In the above embodiments a sputter target has been described which includes the backing plate 100 and the target 112 bonded directly together. FIG. 9 shows another embodiment of a backing plate including an intermediate layer 124 provided on the front side 102 of the backing plate 100. FIG. 9 further shows the target 112 bonded to the backing plate via the intermediate layer 124. The intermediate layer 124 may be an adhesion enhancing layer, and may be of a material different from the material of the backing plate 100 and the target 112. In FIG. 9 the holes 106 are shown. In accordance with embodiments, the surface 102 of the backing plate 100 or the intermediate layer 124 for receiving the target 112 may have an increased roughness to enhance the adhesion of the target.

In the embodiment of FIG. 9, the holes 106 (and also the holes 108—not shown) are formed such that a material layer 126a, 126b remains at the end of the holes 106. Thus, the holes 106 terminate at a distance from the target receiving face of the backing plate 100. In the depicted embodiment, the holes 106 terminate in the intermediate layer 124 with some material of the intermediate layer 126a, 126b remaining. The remaining material is provided with a thickness such that the remaining material breaks once the target 112 has eroded back to the target receiving face or once only a predefined small amount of target material remains on the target receiving face of the backing plate 100 in the area of the holes. The thickness is selected such that the pressure difference between the vacuum chamber and the environment to which the holes 106 are coupled causes the breaking of the remaining material.

Figure 10:
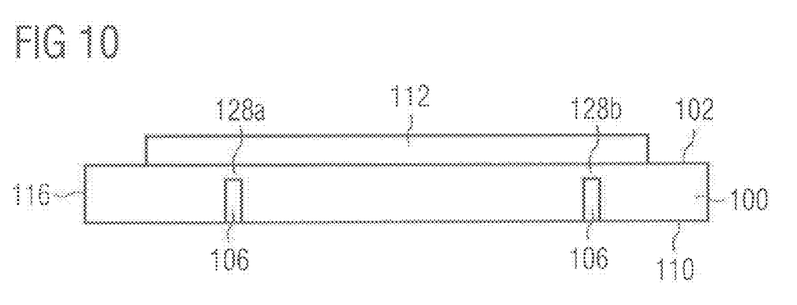
FIG. 10 shows a further embodiment, similar to the one of FIG. 9 but without intermediate layer and with holes terminating at a distance from the front side.

FIG. 10 shows a further embodiment, which is similar to the one of FIG. 9 in that the holes 106 terminate at a distance from the target receiving part, however, no intermediate layer is provided. Thus, the holes 106 terminate at a distance from the front side 102. Thus, the holes 106 terminate with some material 128a, 128b of the backing plate 100 remaining. The remaining material 128a, 128b is provided with a thickness such that the remaining material 128a, 128b breaks once the target 112 has eroded back to the front side 102 or once only a predefined small amount of target material remains on the front side 102 in the area of the holes 106. The thickness is selected such that the pressure difference between the vacuum chamber and the environment to which the opening and/or groove is coupled causes the breaking of the remaining material.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A sputter target comprising:
   a target to be sputtered; and
   a backing plate comprising:
   a target receiving part to which the target to be sputtered is attached; and
   one or more holes extending through the backing plate for exposing the target receiving part through the backing plate,
   wherein the one or more holes coupled to an exterior of a process chamber in which the target is mounted or to an external vacuum shutdown unit,
   wherein, when an erosion groove supported by the target reaches the one or more holes, the one or more holes establishes a fluid path between the exterior of the process chamber and an interior of the process chamber or between the external vacuum shutdown unit and the interior of the process chamber so that fluid from the exterior of the process chamber or from the external vacuum shutdown unit enters the interior of the process chamber through the one or more holes to interrupt a vacuum inside the process chamber causing sputtering to be aborted, and
   wherein the target to be sputtered is attached to the target receiving part so as to seal the one or more holes.

2. The sputter target of claim 1, wherein the one or more holes comprises a plurality of holes extending between the target receiving part and a surface of the backing plate.

3. The sputter target of claim 2, further comprising two opposing main surfaces connected by a side surface, wherein the target receiving part is located at a first main surface, and wherein the plurality of holes extend from the target receiving part at the first main surface to the second surface and/or to the side surface.

4. The sputter target of claim 2, wherein the target receiving part is substantially circular, and wherein the plurality of holes is arranged in a circular pattern at the target receiving part.

5. The sputter target of claim 4, wherein the plurality of holes is arranged in a plurality of concentrically arranged annular patterns.

6. The sputter target of claim 1, further comprising one or more grooves at the target receiving part, which are coupled to the one or more holes.

7. The sputter target of claim 6, wherein the grooves extend from a central region of the target receiving part, and wherein each of the grooves is coupled to an hole.

8. The sputter target of claim 1, further comprising a main surface and a side surface connected to the main surface, wherein the target receiving part covers the entire main surface, and wherein the one or more holes extend from the target receiving part at the main surface to a back surface and/or to the side surface of the backing plate, or wherein the one or more holes comprise one or more grooves formed in the main surface extending to the side surface.

9. The sputter target of claim 8, further comprising a plurality of grooves extending from a central region of the main surface to the side surface.

10. The sputter target of claim 1, wherein the one or more holes is provided such that portions of the target receiving part are exposed at which a target, during use, is expected to be consumed first.

11. The sputter target of claim 1, further comprising a material that is different from the material of the target to be received at the target receiving part.

12. The sputter target of claim 1, further comprising an intermediate layer on one surface of the backing plate, the intermediate layer forming the target receiving part.

13. A sputter target comprising:
a target to be sputtered; and
a backing plate, the backing plate comprising:
a target receiving part to which the target to be sputtered is attached; and
one or more holes in the backing plate for exposing the target receiving part through the backing plate,
wherein the one or more holes is coupled to an exterior of a process chamber in which the target to be sputtered is mounted or to an external vacuum shutdown unit,
wherein the one or more holes establishes a fluid path between the exterior of the process chamber and an interior of the process chamber or between the external vacuum shutdown unit and the interior of the process chamber so that fluid from the exterior of the process chamber or from the external vacuum shutdown unit enters the interior of the process chamber through the one or more holes to interrupt a vacuum inside the process chamber causing sputtering to be aborted,
wherein the target to be sputtered is attached to the target receiving part,
wherein the one or more holes extends from a backside of the backing plate, wherein the one or more holes terminates at a distance from the target to be sputtered with some material remaining between the one or more holes and the target to be sputtered, and
wherein a thickness of the remaining material is selected such that a pressure difference between the process chamber and an environment to which the one or more holes is coupled causes breaking of the remaining material when at least a portion of the target to be sputtered has sufficiently eroded.

14. A sputter target comprising:
a target to be sputtered; and
a backing plate comprising:
two opposing main surfaces connected by a side surface;
a target receiving portion at one of the two main surfaces for receiving the target to be sputtered; and
a plurality of holes extending from the target receiving portion at the one of the two main surfaces to the other one of the two main surfaces, the plurality of holes being arranged in a plurality of concentrically arranged annular patterns,
wherein, when an erosion groove supported by the target reaches one or more of the holes, the holes establish a fluid path between an exterior of a process chamber and an interior of the process chamber or between an external vacuum shutdown unit and the interior of the process chamber so that fluid from the exterior of the process chamber or from the external vacuum shutdown unit enters the interior of the process chamber through the hole to interrupt a vacuum inside the process chamber which causes that sputtering is aborted, and
wherein the target to be sputtered is attached to the target receiving part so as to seal the holes.

15. A sputter target comprising:
a backing plate including a target receiving part for receiving a target to be sputtered, and one or more holes for exposing the target receiving part through the backing plate; and
a target bonded to the target receiving part of the backing plate,
wherein, when an erosion groove supported by the target reaches the hole, the hole establishes an air path between an exterior of a process chamber and an interior of the process chamber or between an external vacuum shutdown unit and the interior of the process chamber so that air from the exterior of the process chamber or from the external vacuum shutdown unit enters the interior of the process chamber through the hole to interrupt a vacuum inside the process chamber which causes that sputtering is aborted, and
wherein the target to be sputtered is attached to the target receiving part so as to seal the hole.

16. A sputter device comprising:
a vacuum process chamber;
a sputter target receptacle for mounting a sputter target at least with its target in the process chamber, the sputter target receptacle including a first port for connecting to a sputter port of the sputter target mounted thereto, and a second port connected to the first port and to an exterior of the process chamber or to an external vacuum shutdown unit, wherein the sputter target is mounted so as to seal the first port of the sputter target receptacle; and
a holder for receiving an element to be processed,
wherein, when an erosion groove supported by the target reaches the first port, the first port and the second port establish a fluid path between the exterior of the process chamber and an interior of the process chamber or between the external vacuum shutdown unit and the interior of the process chamber so that fluid from the exterior of the process chamber or from the external vacuum shutdown unit enters the interior of the process chamber through the hole to interrupt a vacuum inside the process chamber which causes that sputtering is aborted, wherein the sputter target includes a backing plate and the target, the backing plate including two opposing main surfaces connected by a side surface, a target receiving portion at one of the two main surfaces to which the target to be sputtered is bonded, and a plurality of holes extending from the target receiving portion at the one of the two main surfaces to the other one of the two main surfaces, the plurality of holes being arranged in a plurality of concentrically arranged annular patterns, wherein the target is bonded to the target receiving portion, and wherein the sputter target is mounted to the sputter target receptacle with the plurality of holes at the other one of the main surfaces of the backing plate coupled to the first port of the sputter target receptacle.

17. The sputter device of claim 16, wherein the external vacuum shutdown unit arranged outside the process chamber and connected to the second port of the sputter target receptacle is configured to apply the fluid to the first port of the sputter target receptacle.

18. The sputter target of claim 1, wherein the fluid comprises air.

19. The sputter target of claim 1, wherein the fluid comprises a liquid.

20. The sputter target of claim 19, wherein the liquid is water.

21. The sputter target of claim 6, wherein the grooves extend from a central region of the target receiving part, and wherein a central hole is provided at the central region to which all grooves are coupled.

* * * * *